United States Patent [19]

Tuska et al.

[11] Patent Number: 4,937,467
[45] Date of Patent: Jun. 26, 1990

[54] COMPLEMENTARY CIRCUIT AND STRUCTURE WITH COMMON SUBSTRATE

[75] Inventors: James W. Tuska, Hopewell Township, Mercer County; Lawrence A. Goodman, Plainsboro, both of N.J.

[73] Assignee: General Electric Company, Schenectady, N.Y.

[21] Appl. No.: 411,424

[22] Filed: Sep. 22, 1989

Related U.S. Application Data

[62] Division of Ser. No. 232,243, Aug. 15, 1988.

[51] Int. Cl.⁵ .......................... H03L 5/00; H03K 3/01
[52] U.S. Cl. .................................. 307/264; 307/270; 307/585; 318/293
[58] Field of Search ............... 307/585, 270, 264, 496, 307/497; 318/293

[56] References Cited

U.S. PATENT DOCUMENTS

| | | | |
|---|---|---|---|
| 4,029,973 | 6/1977 | Kobayashi et al. | 307/264 |
| 4,039,862 | 8/1977 | Dingwall et al. | 307/264 |
| 4,616,305 | 10/1986 | Damiano et al. | 318/293 |
| 4,703,199 | 10/1987 | Ely | 307/264 |
| 4,710,686 | 12/1987 | Guzik | 318/293 |
| 4,719,396 | 1/1988 | Shimizu | 318/293 |
| 4,845,381 | 7/1989 | Cuevas | 307/264 |

Primary Examiner—Stanley D. Miller
Assistant Examiner—Richard Roseen
Attorney, Agent, or Firm—Henry I. Steckler; James C. Davis, Jr.; Paul R. Webb, II

[57] ABSTRACT

A circuit in accordance with the invention has a complementary pair of a MISFET and a COMFET with their drains connected together. This allows fabrication on a single substrate for greater reliability and reduced cost. The circuit can be used in a full or one half "H-bridge" configuration for controlling current through a load such as a motor.

12 Claims, 2 Drawing Sheets

COMPLEMENTARY CIRCUIT AND STRUCTURE WITH COMMON SUBSTRATE

This application is a division, of application Ser. No. 07/232,243, filed Aug. 15, 1988.

BACKGROUND OF THE INVENTION

The present invention relates to complementary circuits and structures, and more particularly, to such circuits and structures that provide reversible currents, such as for motor control.

Many applications, such as power seats, power windows, power door locks, retractable headlights, etc., in an automobile, require the application of a reversible current to a load, such as a DC motor, wherein the direction of current flow is controlled by low level logic signals. This can be done by a complementary pair of field effect transistors (FETs) or a pair of NPN and PNP bipolar transistors. FETs are especially desirable due to their low drive current requirements. More particularly, in order to obtain a low source to drain voltage drop, while controlling a large, e.g., at least one ampere, load current, vertical FETs are required, wherein the drain output terminal is the substrate. However, the complementary configuration typically requires separate substrates in separate packages or hybrid construction since the drains are of opposite conductivity type. This increases packaging and testing costs and reduces reliability due to the required interconnections.

It is, therefore, desirable to have a complementary vertical FET circuit and structure that can be fabricated on a common substrate.

SUMMARY OF THE INVENTION

A circuit in accordance with the invention for providing a current to a load having first and second terminals from first and second power supply terminals in accordance with first and second control signals of opposite logic levels comprises a vertical COMFET having a source adapted to be coupled to the first power supply terminal, a drain adapted to be coupled to the first load terminal, and a gate adapted to receive the first control signal; and a MISFET having a source adapted to be coupled to the second power supply and second load terminals, a drain coupled to said COMFET drain, and a gate adapted to receive the second control signal.

A structure in accordance with the invention comprises a semiconductor substrate having first and second portions, an anode region of a first conductivity type disposed in both of said portions and first and second drain regions of first and second conductivity type, respectively, disposed in said first and second portions of said substrate, respectively, overlying said anode region; first and second body regions of second and first conductivity type, respectively, disposed in said first and second portions, respectively, adjacent said first and second drain regions, respectively; first and second source regions of first and second conductivity type, respectively, disposed in said first and second portions, adjacent said first and second body regions, respectively; first and second insulating layers disposed over said first and second body regions, respectively; and first and second gates disposed over said first and second insulating layers, respectively.

DESCRIPTION OF THE DRAWING

FIG. 1 is a schematic diagram of a first embodiment of a circuit in accordance with the invention, while

DETAILED DESCRIPTION

Figure 1:
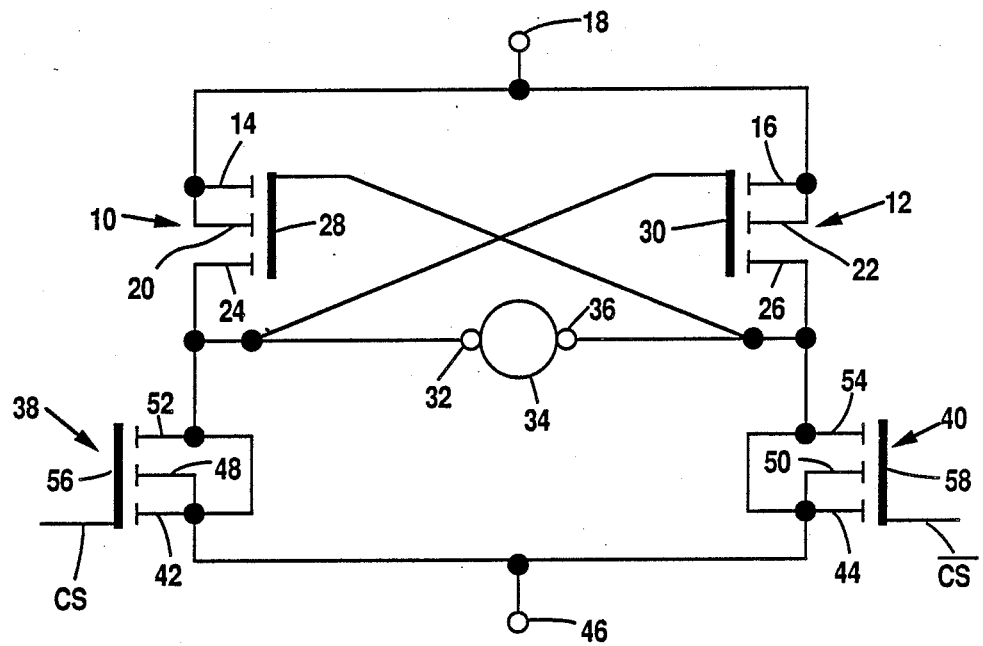

FIG. 1 shows a full "H-bridge" circuit comprising first and second vertical P-channel conductivity modulated field effect transistors (COMFETs) 10 and 12. The COMFETs 10 and 12 respectively comprise sources 14 and 16 connected to a high voltage, e.g., +12 volts, first terminal 18, bodies 20 and 22 respectively connected to the sources 14 and 16 (in order to stabilize the threshold voltage, and especially to avoid thyristor action in the COMFETs 10 and 12), drains 24 and 26, and gates 28 and 30. The drain 24 and the gate 30 are connected to each other and to the first terminal 32 of a load 34, such as a reversible DC motor, while the drain 26 and the gate 28 are connected to each other and to a second terminal 36 of said motor 34. COMFETs 10 and 12 are shown in more detail in U.S. Pat. No. 4,364,073.

First and second vertical N-channel metal insulator semiconductor field effect transistors (MISFETs) 38 and 40 respectively comprise sources 42 and 44 connected to a low voltage, e.g., 0 volts, second power supply terminal 46 and to substrates 48 and 50, respectively, drains 52 and 54 respectively connected to the drains 24 and 26 and, thus, to the first and second load terminals 32 and 36, respectively, and gates 56 and 58 respectively receiving first and second control signals CS and $\overline{CS}$ of opposite logic levels. The MISFETs 38 and 40 can have an oxide gate insulating layer and, thus, comprise metal oxide semiconductor field effect transistors (MOSFETs).

If desired, the COMFETs 10 and 12 can have N-channels, while the MISFETs 30 and 40 can have P-channels. However, such an arrangement requires about three times the area of the preferred embodiment for the same voltage drop and current capability.

In operation, if signal CS has a positive high value, e.g., +5 volts, then signal $\overline{CS}$ has a low value, e.g., 0 volts. This turns ON (conducting) MISFET 38 and keeps MISFET 40 OFF (non-conducting). In turn, COMFET 10 is OFF and COMFET 12 is ON due to the voltages at their respective gates 28 and 30 and drains 24 and 26. Conventional current then flows from first power supply terminal 18 through COMFET 12, second motor terminal 36, first motor terminal 32, MISFET 38 and to second power supply terminal 46, thereby causing a first rotation direction of the motor 34.

If it is desired to reverse the rotation direction of the motor 34, then signal CS is made low, e.g., 0 volts, and signal $\overline{CS}$ is made high, e.g., 5 volts. This turns ON MISFET 40 and turns OFF MISFET 38. In turn, COMFET 10 is ON and COMFET 12 is OFF. Current now flows from the first power supply terminal 18, through COMFET 10, first motor terminal 32, second motor terminal 36, i.e., the reverse direction as that described above, MISFET 40, and to second power supply terminal 46.

Figure 1A:
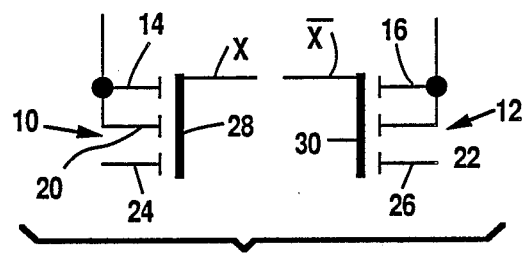
FIG. 1A shows a modification of FIG. 1.

For high voltage applications, e.g., at least 50 volts, the cross-coupling between the gate 28 and drains 26 and 54 and between the gate 30 and the drains 24 and 52 cannot be present since the gates 28 and 30 will then breakdown to the sources 14 and 16, respectively, for a typical gate insulator thickness of about 1000Å (Angstroms). FIG. 1A shows that in this case the gates 28 and 30 would be driven by separate voltage sources (not shown) providing third and fourth control signals X and $\bar{X}$ of opposite logic levels. The unshown portion of the circuit in FIG. 1A is identical to that of FIG. 1. When it is desired to turn ON the COMFETs 10 and 12, the voltage at the gates 28 and 30, respectively, will be the voltage at the terminal 18 minus a difference voltage sufficient to turn ON the COMFETs 10 and 12. The difference voltage typically is between about 5 to 15 volts, e.g., if the voltage at terminal 18 is 50 volts and the difference voltage is 10 volts, then the turn ON voltage at the gates 28 and 30 would be 40 volts. To turn OFF the COMFETs 10 and 12 the voltage at the gates 28 and 30 would be the voltage at the terminal 18, e.g., 50 volts in the above example.

For both FIGS. 1 and 1A the gates 28 and 30 receive antiphase signals with respect to the signal at the other gate 30 and 28, respectively.

Figure 2:
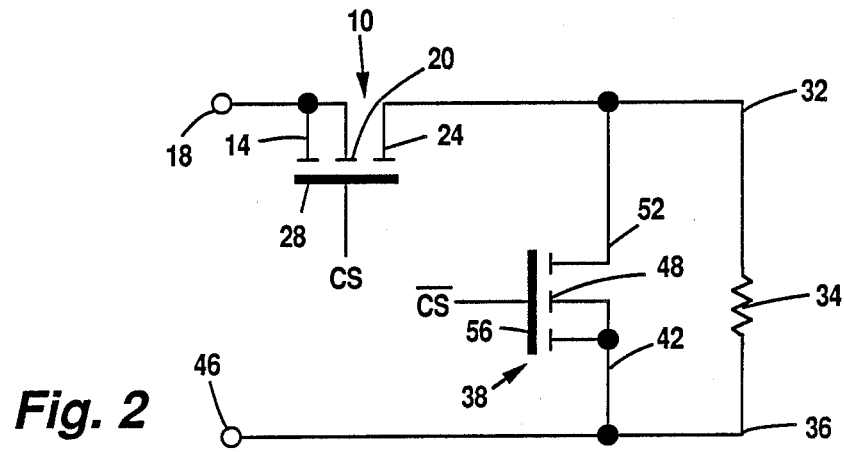
FIG. 2 is a schematic diagram of a second embodiment of a circuit in accordance with the invention.

FIG. 2 shows a one half "H-bridge" circuit comprising a P-channel COMFET 10 having a source 14 coupled to a body 20 and also to a first power supply terminal 18 of e.g., 50 volts, a gate 28 receiving a first control signal CS, and a drain 24 coupled to a first load terminal 32 of a load 34. An N-channel MOSFET 38 has a drain 52 coupled to the drain 24 and also to the first load terminal 32, a gate 56 receiving a second control signal $\overline{CS}$, and a source 42 coupled to a body 48 and also to a second power supply terminal of, e.g., 0 volts, and to a second load terminal 36.

In operation, when the control signal CS is, e.g., 40 volts, and the control signal $\overline{CS}$, is, e.g., 0 volts, the COMFET 10 is ON and the MISFET 38 is OFF. Thus, current flows from the first power supply terminal 18, through the COMFET 10, the load 34 and to the second power supply terminal 46. When the control signal CS is, e.g., 50 volts and the control signal $\overline{CS}$ is, e.g., 10 volts, the COMFET 10 is OFF and the MISFET 38 is ON. Current from the load 34 then flows through the MISFET 38. This is especially useful when the load 34 is resonant, thereby saving power. Several such one half bridges as shown in FIG. 2 are also useful in multiphase motor control.

Figure 3:
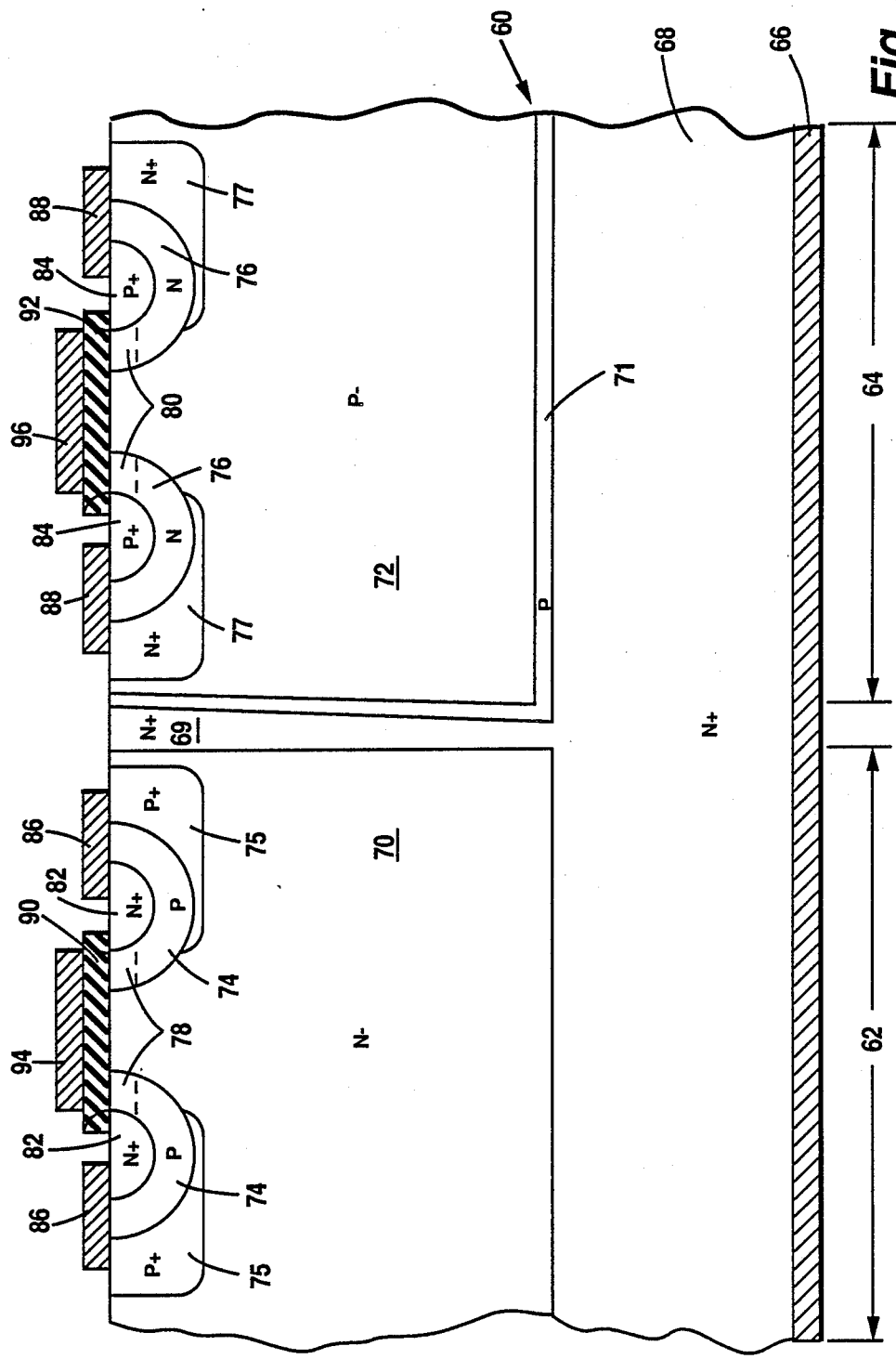
FIG. 3 is a cross-sectional view of a structure in accordance with the invention.

FIG. 3 shows a semiconductor substrate 60, such as Si, having first and second portions 62 and 64. An anode or drain conducting contact 66 such as a sandwich structure of Al/Ti/Ni, with a typical total thickness of 10,000Å is disposed at the bottom thereof. An N+ conductivity type anode region 68, with a typical thickness between about 250 to 500 μm (micrometers), is adjacent to the contact 66 in both portions 62 and 64 and has a peak doping concentration between about $10^{18}$ to $10^{20}$ cm$^{-3}$. An extension region 69 of the anode region 68 lies between the first and second portions 62 and 64 to provide isolation therebetween and to establish boundary conditions. First and second drain regions 70 and 72 are disposed in the first and second portions, respectively, overlying the anode region 68 and having N- and P- conductivity types, respectively, with a peak doping concentration between about $10^{14}$ to $10^{16}$ cm$^{-3}$ for high and low breakdown voltages, respectively. Within the drain region 72 is a P-conductivity type buffer layer 71 with a thickness between about 5 to 10 μm and a doping level between about $10^{16}$ to $10^{17}$ cm$^{-3}$.

The buffer layer 71 minimizes latch-up and results in a high operating speed for the COMFET. The regions 69, 70, 71, and 72 can be formed by vapor phase epitaxial techniques with respective appropriate dopants, which may then be diffused and with a typical thickness of regions 70 and 72 between about 5 to $\phi$μm depending upon the desired breakdown voltage across said regions 70 and 72.

Adjacent the drain regions 70 and 72 are first and second body regions 74 and 76, respectively, having P and N conductivity types, respectively, with a peak doping concentration of about $10^{17}$ cm$^{-3}$ and with a thickness between about 2 to 4 μm. In operation, channel regions 78 and 80 form in the body regions 74 and 76, respectively. Also, during operation the P-N junctions formed between regions 74 and 70 and also between regions 76 and 72 are reverse biased, thereby providing isolation between the drain regions 70 and 72 and the body regions 74 and 76, respectively. Adjacent the body regions 74 and 76 are N+ and P+ conductivity type source regions 82 and 84, respectively, with a doping concentration of about $10^{20}$ cm$^{-3}$ and a peak depth between about 0.5 to 1 μm. Also adjacent the first and second body regions 74 and 76 are P-conductivity type third and N-conductivity type fourth body regions 75 and 77, respectively, with a peak doping concentration between about $10^{19}$ to $10^{20}$ cm$^{-3}$ and a maximum depth of about 5 μm. The regions 75 and 77 permit the conducting layers 86 and 88 (described below) to make a good contact to the regions 74 and 76, respectively, and also minimize parasitic bipolar transistors that can cause latch up. Conducting layers 86 and 88 such as Al, connect the source region 82 to the body region 74 and connect the source region 84 to the body region 76, respectively, and provide source contacts. Overlying the body regions 74 and 76 are insulating layers 90 and 92, respectively, such as SiO$_2$ or Si$_3$N$_4$, with a thickness between about 500 to 1500Å. Conducting gates 94 and 96, such as Al or heavily doped polysilicon, with a thickness between about 10,000 to 40,000Å, overlie the layers 90 and 92, respectively, and also the channel regions 78 and 80, respectively.

It will be seen that the FETs formed in the first and second portions 62 and 64 can be the MISFET 38 and the COMFET 10 of FIGS. 1 and 2, or the MISFET 40 and the COMFET 12 of FIG. 1.

Since the anode region 68 has the same conductivity type for both the P-channel COMFETs 10 and 12 and the N-CHANNEL MISFETs 38 and 40, and since the drains of a complementary pair are connected together, the present invention allows single substrate construction for such a pair. In turn, this reduces costs and increases reliability. Further, if desired, more than one such pair can be made in a single substrate by using isolation techniques, such as buried layers and junction isolation, as known in the art.

What is claimed is:

1. A circuit for providing a reversible current from first and second power supply terminals in accordance with first and second control signals of opposite logic levels and first and second gate signals of opposite logic levels, said circuit comprising:
 a motor load having first and second load terminals;
 first and second vertical COMFETs each having a source coupled to the first power supply terminal, a drain coupled to the first and second load terminals, respectively, and a gate receiving the first and second gate signals respectively; and first and second vertical MISFETs each having a source adapted to be coupled to the second power supply terminal, a drain coupled to said drains of said first and second COMFETs, respectively, and a gate adapted to receive said first and second control signals, respectively.

2. The circuit of claim 1, wherein each of said COMFET gates is coupled to the drain of the other COMFET.

3. The circuit of claim 1, wherein said first and second gate signals comprise third and fourth control signals, respectively.

4. A circuit as claimed in claim 1 further comprising a substrate including at least said first COMFET and said first MISFIT.

5. A circuit as claimed in claim 1, wherein said MISFETs each comprise an N-channel MISFET, said COMFETs each comprise a P-channel COMFET, and said first power supply terminal has a higher voltage than said second power supply terminal.

6. A circuit as claimed in claim 1, further comprising a conductor connecting the body of each of said MISFETs and COMFETs to the source of the same MISFET or COMFET, respectively.

7. A circuit as claimed in claim 1 wherein each of said MISFETs comprise a MOSFET.

8. A circuit for providing a current from first and second power supply terminals in accordance with first and second control signals of opposite logic levels, said circuit comprising:
a motor load having first and second load terminals;
a vertical COMFET having a source adapted to be coupled to the first power supply terminal, a drain coupled to the first load terminal, and a gate adapted to receive the first control signal; and
a MISFET having a source adapted to be coupled to the second power supply and second load terminals, a drain coupled to said COMFET drain, and a gate adapted to receive the second control signal.

9. A circuit as claimed in claim 8 further comprising a substrate including at least said first COMFET and said first MISFIT.

10. A circuit as claimed in claim 8 wherein said MISFET comprises an N-channel MISFET and said COMFET comprises a P-channel COMFET.

11. A circuit as claimed in claim 8 wherein said MISFET comprises a MOSFET.

12. A circuit as claimed in claim 8 further comprising a conductor connecting the body of said MISFET and said COMFET to the source of the same MISFET or COMFET, respectively.

* * * * *